United States Patent [19]
Jeng et al.

[11] Patent Number: 5,744,865
[45] Date of Patent: Apr. 28, 1998

[54] HIGHLY THERMALLY CONDUCTIVE INTERCONNECT STRUCTURE FOR INTERGRATED CIRCUITS

[75] Inventors: Shin-Puu Jeng; Mi-Chang Chang, both of Plano, Tex.

[73] Assignee: Texas Instruments Incorporated, Dallas, Tex.

[21] Appl. No.: 735,356

[22] Filed: Oct. 22, 1996

[51] Int. Cl.$^6$ ............................ H01L 23/48; H01L 23/52
[52] U.S. Cl. ................. 257/750; 257/752; 257/753; 257/758; 257/759; 257/764; 257/638
[58] Field of Search ........................ 257/750, 752, 257/753, 758, 759, 764, 634, 633, 638

[56] References Cited

U.S. PATENT DOCUMENTS

| | | | |
|---|---|---|---|
| 4,843,034 | 6/1989 | Herndon et al. | 437/189 |
| 4,879,258 | 11/1989 | Fisher | 437/225 |
| 5,117,276 | 5/1992 | Thomas et al. | 257/758 |
| 5,336,368 | 8/1994 | Iacovangelo et al. | 156/656 |
| 5,352,493 | 10/1994 | Dorfman et al. | 427/530 |
| 5,356,513 | 10/1994 | Burke et al. | 156/636 |
| 5,366,911 | 11/1994 | Lur et al. | 437/40 |
| 5,432,128 | 7/1995 | Tsu | 437/194 |
| 5,476,817 | 12/1995 | Numata | 437/195 |
| 5,519,250 | 5/1996 | Numata | 257/632 |
| 5,530,290 | 6/1996 | Aitken et al. | 257/758 |
| 5,530,293 | 6/1996 | Cohen et al. | 257/752 |
| 5,548,159 | 8/1996 | Jeng | 257/634 |
| 5,559,367 | 9/1996 | Cohen et al. | 257/758 |
| 5,625,232 | 4/1997 | Numata et al. | 257/758 |

*Primary Examiner*—Tom Thomas
*Assistant Examiner*—Alexander Oscar Williams
*Attorney, Agent, or Firm*—Bret J. Petersen; James C. Kesterson; Richard L. Donaldson

[57] ABSTRACT

A method and structure for improving the thermal conductivity and therefore the heat dissipation of densely interconnected semiconductor circuits, particularly those utilizing low dielectric constant materials by placing a layer of highly thermally conductive material such as diamond film 26 between layers of interconnect metal 22. An embodiment of the present invention allows increased thermal conductivity from the upper levels of metalization to the substrate 10 where structure of the present invention is repeated to form multiple levels of interconnects stacked one upon the other. Further, the diamond layer of the present invention may be used as an effective etch stop or planarization stop. The present invention can be used with known low dielectric constant materials, interlevel dielectrics 30 and planarization techniques with the added benefit of highly thermally conductive diamond film.

20 Claims, 3 Drawing Sheets

HIGHLY THERMALLY CONDUCTIVE INTERCONNECT STRUCTURE FOR INTERGRATED CIRCUITS

CROSS-REFERENCES TO RELATED APPLICATIONS

The following previously filed application by applicants herein are related to the instant application and are incorporated herein by reference.

| Serial No. | TI Case | Filing Date | Title |
|---|---|---|---|
| S/N 08/728,879 | TI-20784 | 10/12/95 | A Low Capacitance Interconnect Structure For Integrated Circuits |
| S/N 08/137,658 | TI-18509 | 10/15/93 | Planarized Structure for Line-Capacitance Reduction |
| S/N 08/298,807 | TI-19532 | 08/03/94 | Improving Interconnect Capacitance Between Metal Leads |

FIELD OF THE INVENTION

This invention generally relates to interconnections in integrated circuits. More particularly, it relates to improving thermal conductivity of interconnect structures in integrated circuits by a structure which includes a highly thermally conductive material such as diamond film.

BACKGROUND OF THE INVENTION

Individual semiconductor devices in VLSI (Very Large Scale Integration) integrated circuits are typically interconnected by means of one or more patterned electrically conductive layers comprising a high conductivity metal or metal alloy. As integrated circuits have continued to shrink in size and increase in complexity with each new generation of devices, integrated circuits increasingly require very close spacing of interconnect lines and many now require multiple levels of metalization, as many as five, to interconnect the various circuits on the device. Multilevel metal (MLM) interconnect permits crossing over of interconnection paths in different metal layers, to provide for higher density interconnects.

Multilevel metal interconnects for semiconductor integrated circuit devices are made conventionally by depositing and patterning alternating layers of a conductive material, typically sputtered aluminum alloys such as Al-0.5%Cu, and layers of an insulating dielectric material, typically SiO$_2$. Small holes or contact vias through the dielectric layers are filled with conductive material to permit interconnection of the conductive layers.

Since closer spacing of interconnects increases capacitance between adjacent lines, as the device geometries shrink and densities increase capacitance and cross talk between adjacent lines becomes more of a problem. Therefore, it has become increasingly more desirable to use lower dielectric materials to offset this trend and thereby lower capacitance between closely spaced interconnects.

The intermetal dielectric or interlevel dielectric is an insulating material used between levels of interconnects on integrated circuits. The interlevel dielectric of the prior art is typically SiO$_2$ which has a dielectric constant of about 4.0. Typically, SiO$_2$ is used both between the interconnects in the horizontal direction and between layers of the interconnects. It would be desirable to replace at least some portion of this material with a material having a lower dielectric constant.

As used herein, low dielectric constant or low-k means a material having a dielectric constant of lower than about 3.5 and preferably lower than 3 and most preferably about 2 or lower. Unfortunately, materials having a lower dielectric constant have characteristics that make them difficult to integrate into existing integrated circuit structures and processes. Many polymeric materials such as polysilsequioxane, parylene, polyimide, benzocyclobutene and amorphous Teflon have lower dielectric constants (lower permitivities). Compared to SiO$_2$, these materials typically have low mechanical strength, poor dimensional stability, poor temperature stability, high moisture absorption/permeation, poor adhesion, large thermal expansion coefficient and an unstable stress level. Because of these attributes, the use of polymer or other low dielectric materials as a stand alone replacement for SiO$_2$ in integrated circuit processes or structures is very difficult if not impossible.

SUMMARY OF THE INVENTION

Increased density of interconnects in combination with more levels of metalization puts an increasing amount of heat into the upper levels of the semiconductor structure that must be effectively dissipated to the substrate and then to the chip packaging or exterior heat sink. In addition, low dielectric materials often are also thermally insulative or less thermally conductive compared to traditional interlevel dielectric materials. Therefore, in structures utilizing such materials thermal conduction becomes even more of an issue.

Diamond is of high interest as a dielectric material by reason of its low electrical conductivity and high thermal conductivity and consequent efficiency as a heat sink material. While diamond is more commonly known for hardness and brilliance, diamond as referenced herein is a synthetic diamond film or diamond-like-carbon, often applied to a semiconductor surface by chemical vapor deposition or laser ablation.

In accordance with the present invention, an improved structure and method is provided for improving the heat dissipation of densely interconnected semiconductor circuits, particularly those utilizing low dielectric constant materials. This is apparently the first use of diamond film as a thermally conductive interlevel dielectric in combination with low dielectric constant materials.

An advantage of the present invention is increased thermal conductivity between the upper levels of metalization and the substrate where the method and structure of the present invention is repeated to form multiple levels of interconnects stacked one upon the other.

An additional advantage of the present invention may be the diamond film used as an effective etch stop or planarization stop. Since the diamond film is harder than the interdielectric layer, planarity of the CMP process will be enhanced.

A further advantage of the present invention is the use of known low dielectric constant materials, interlevel dielectrics and planarization techniques with the added benefit of highly thermally conductive diamond film.

BRIEF DESCRIPTION OF THE DRAWINGS

The novel features believed characteristic of the invention are set forth in the appended claims. The invention itself, however, as well as other features and advantages thereof, will be best understood by reference to the detailed descrip- FIGS. 1–6 Represents the process flow for an embodiment of the present invention, a cross-section of metal interconnects on a semiconductor substrate having low dielectric constant materials in critical areas and diamond film to increase thermal conductivity;

DETAILED DESCRIPTION OF THE PREFERRED EMBODIMENTS

The preferred embodiments of the present invention are best understood by referring to FIGS. 1–10 of the drawings, like numerals are used for like and corresponding parts of the various drawings.

Figure 1:
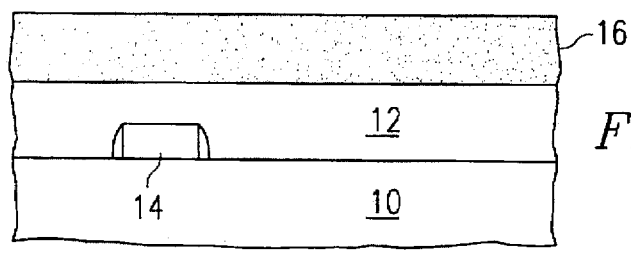

The embodiment illustrated in FIGS. 1–6, described in the following paragraphs, shows a sequence of operations to fabricate metal interconnects in a typical semiconductor circuit. Metal interconnections are normally located over the top of active devices fabricated on the surface of a wafer of semiconducting material such as silicon crystal, often referred to as a substrate. FIG. 1 illustrates an insulating layer 10 over a silicon semiconductor substrate 12. Semiconductor substrate 12 will normally include several layers of various semiconductor materials which make up the active components of the semiconductor device. For simplicity, these layers and devices are represented by transistor gates 14 shown on the substrate layer 12. Insulating layer 10 may be any material suitable for insulating metal interconnect lines 10 from components or other materials in layers below.

Again referring to FIG. 1 and the first preferred embodiment, a highly thermally conductive material, such as diamond film 16 is applied to the surface of the wafer. The diamond film is preferably applied by CVD. The deposition process is as known in the art, such as disclosed by U.S. Pat. No. 5,352,493 to Doffman at. al. and incorporated herein by reference. The thickness of the diamond film depends on such factors as the desired separation of conductors, stresses caused thermal expansion etc. It is normally desirable to replace as much $SiO_2$ of the interlevel dielectric as possible with high thermal conductivity material while still leaving some amount of $SiO_2$ for planarization and process margin. In a preferred embodiment, for example, a thickness of about 3,000–7,000 Å of diamond film is used to provide a total vertical separation of about 10,000 Å between interconnect layers.

Figure 2:
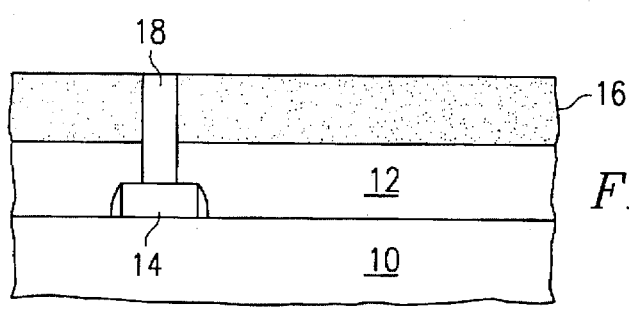

FIG. 2 represents forming vias 18 through the diamond film layer 16. Vias are formed by methods known in the art. Vias are placed where connection is desired from underlying circuits such as the gate 14 shown in FIG. 2 to a metal interconnect which will be formed as discussed below.

Figure 3:
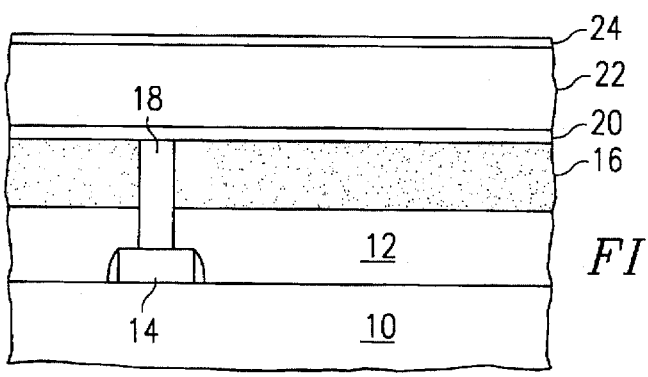

The preferred embodiment includes an adhesion layer 20 as shown in FIG. 3. The adhesion layer is preferable formed from titanium. This layer aids in the adhesion of the aluminum metal layer to the diamond film layer 16. The adhesion layer is preferably applied by sputtering titanium to a thickness of about 100–200 Å.

After application of the adhesion layer, a conductive layer 22 for the interconnects is applied. The preferred conductive layer is a trilayer of TiN/AlCu/TiN 22 as shown in FIG. 3. Generally, the TiN is sputtered on at 200° C. at a thickness of 500 angstroms. The aluminum copper alloy is preferably a mixture of 99 to 99.5% aluminum and 0.5 to 1.0% copper. The AlCu is also sputtered on at a temperature of between 100° and 200° C. at a thickness of 6000 angstroms. Then another layer of TiN is sputtered on, again at 200° C. and 500 angstroms thick.

In a preferred embodiment, the conductive layer is followed by an oxide overlayer 24. The oxide over-layer is preferably TEOS $SiO_2$. Use of an over-layer or other cap layer is useful for extending the channel that will be filled with low dielectric material to insure low dielectric material occupies fringe areas of the electric field between adjacent interconnects. Use of an over-layer in this way is disclosed in U.S. application Ser. No. 08/298,807 filed Aug. 3 1994 by Jeng et. al.

Figure 4:
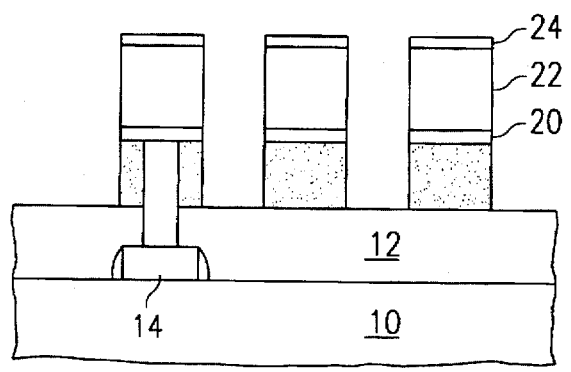

The adhesion layer, interconnect layer and over-layer as described above are masked with a resist, patterned and etched with one of several methods known in the art. This procedure results in metal connecting lines 22 as part of an interconnect stack 28 as shown in FIG. 4 with the over-layer 24 above the metal interconnects and the adhesion layer 20 and diamond layer 16 below the interconnects. A preferred method of etching the stacks is first etching the metal interconnects with $Cl_2$ followed by etching the diamond film with $O_2$ plasma. The advantage of using $O_2$ plasma is the plasma will not etch the aluminum and the $SiO_2$ is a good etch stop. However, is not necessary to completely etch the diamond film to layer 10 as shown. But it may be desirable to etch at least some of the diamond film from between the interconnects to insure low-k material in the fringe areas of the electric field, to further reduce capacitance, and to reduce problems associated with mismatched coefficients of thermal expansion.

The method of the present invention contemplates using high aspect ratio metal interconnects, where the thickness of the interconnect metal is greater than the width. The high aspect ratio interconnects are useful to reduce line resistance while maintaining close spacing for high density circuits. Connection between the interconnects and the circuits below is represented by the via and plug 18. The number and location of vias is determined by the underlying circuit design.

After etching the interconnect stack, a low dielectric constant material 26 is preferably applied on the surface of the wafer. In the preferred embodiment discussed below, application of the low dielectric material is described according to the method disclosed in the earlier filed application listed above. Application of the low dielectric material may also be done according to other methods such as in U.S. Ser. No. 08/202,057 by applicant herein, or U.S. Ser. No. 08/250,142 by Haveman.

Figure 5:
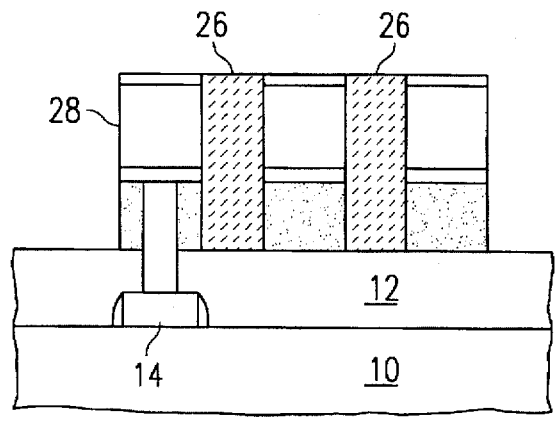

FIG. 5 illustrates a low dielectric constant material 26 placed between interconnect stacks 28 in critical areas. Critical areas are closely spaced metal interconnects 28 where capacitance is a problem. Non-critical areas are areas between metal interconnects which are either spaced sufficiently or for other reasons capacitance is not a problem, such as interconnects carrying low frequency signals.

The low-k material 26 is applied in sufficient thickness to fill critical areas between the metal interconnects 28, shown in FIG. 5. In a preferred embodiment, the low-k material is applied by the spin-on method, which is where the material is dropped in a liquid form onto the spinning wafer and the material disperses across the wafer. Spin-on application typically results in the material being deposited with a varying thickness across the wafer. The thickness of the material usually will be thicker in areas where the width of the gap is narrow. In this embodiment, spin-on glass, e.g. polysilsequioxane, is preferably used for the low-k material 26 and is cured, e.g. 400° C. for one hour, typically in a nitrogen ambient. Other preferred materials are those listed in the table below, which have a dielectric constant of less than about 3.5, including porous materials such as Aerogel or Xerogel which have a dielectric constant of about 1 to 2.

In a preferred embodiment, critical areas are then masked with resist and the low-k material 26 is etched from the non-critical areas and the mask material is removed. Etching of the low-k material can be done with either dry or wet etch processes known in the art. The low-k material can be etched with an end point detection etch, for example an anisotropic oxygen plasma etch stopping when portions of the oxide over-layer are exposed. Such a process is disclosed in U.S. patent application Ser. No. 08/242,922 for "A Low-temperature Anisotropic Ash Process for Resist," filled Jun. 16, 1994 by Jeng and incorporated herein by reference.

Figure 6:
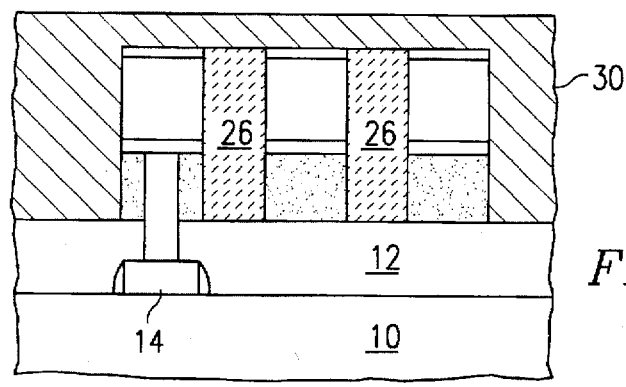

Referring to FIG. 6, after the low-k layer is applied, the interlayer dielectric layer 30 can be applied and planarized, resulting in a preferred embodiment as shown. In a preferred embodiment, the interlayer dielectric is TEOS $SiO_2$ deposited by plasma enhanced chemical vapor deposition (PECVD) and planarized by chemical mechanical polishing (CMP).

Figure 7:
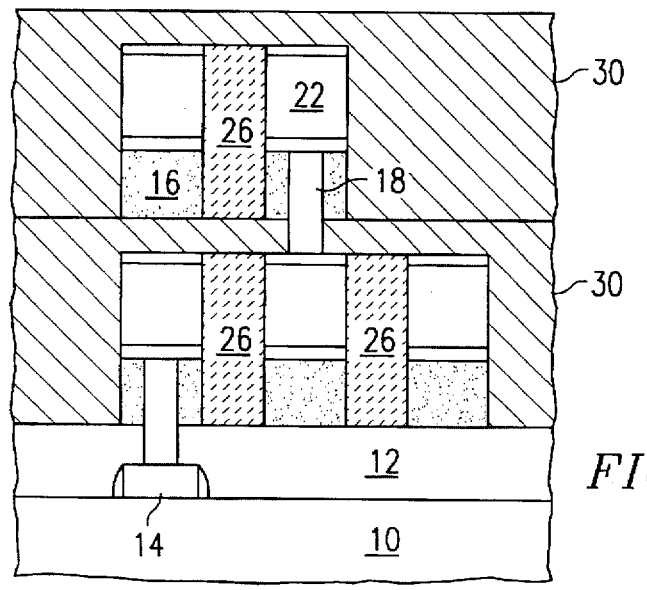
FIG. 7 Shows an alternate embodiment with multiple levels.

The method and structure of the present invention may be repeated to form multiple levels of interconnects stacked one upon the other, illustrated in FIG. 7. Typically this will necessitate vias and contacts 18 from one level to the next as shown. In prior art structures, thermal conductivity from upper levels of metalization depends primarily on the interlevel dielectric (metal in the form of via plugs provide some thermal conductivity). An advantage of the present invention is increased thermal conductivity from the upper levels of metalization to the substrate by replacing some of the conventional interlevel dielectric material with highly thermally conductive material in the manner shown.

Figure 8:
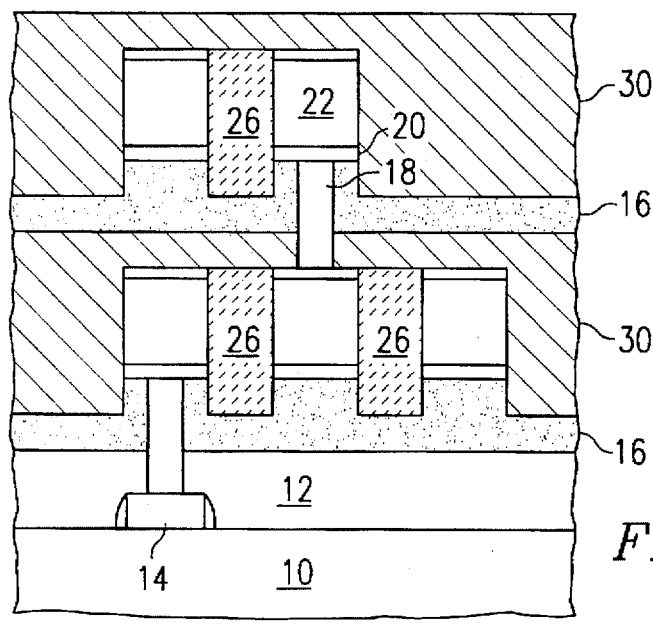
FIG. 8 Shows another embodiment where the diamond film is not completely etched away in areas not directly below the interconnects.

FIG. 8 illustrates an embodiment similar to that discussed above. In this embodiment, the thermally conductive layer 16 was not entirely etched away in areas not directly below the interconnects. The conductive layer 16 is preferably etched below the level of the adhesion layer 20 to insure low-k material being placed in areas of fringe electrical fields as discussed above, but some of the conductive layer is left intact. This embodiment has the advantage of increased horizontal thermal conductivity. Even a small layer of diamond remaining across the surface is beneficial because diamond's thermal conductivity is about 700 times that of $SiO_2$. Horizontal thermal conductivity is particularly advantageous where there are large areas without metal interconnects on a particular layer. Heat from upper layers would be conducted around these areas on the horizontal layer of the high thermal conductivity material.

Figure 9:
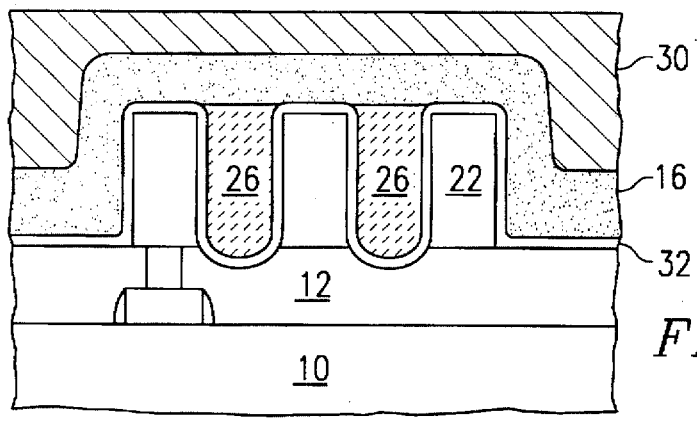
FIG. 9 Shows another embodiment where the diamond film is applied subsequent to forming the interconnects.
Figure 10:
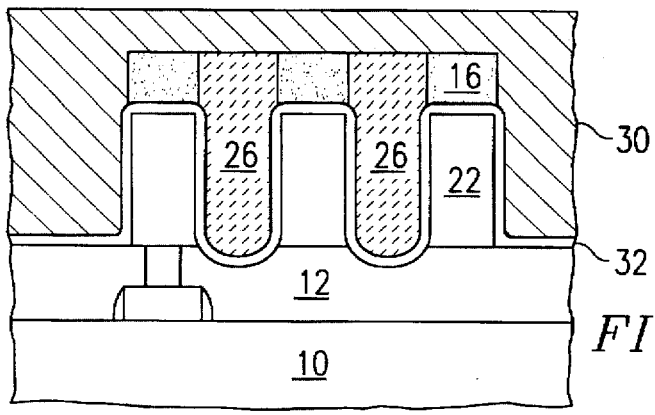
FIG. 10 Illustrates an additional embodiment also where the diamond film is applied subsequent to forming the interconnects.

Features of an additional embodiment are shown in FIGS. 9 and 10. In these embodiments, the diamond layer is applied after the interconnects have been etched. In this second embodiment, the channels between the interconnects may be overetched to extend beyond the bottom of the interconnect layer. This structure is advantageous because it allows the low dielectric constant material to extend beyond the actual interconnects to decrease capacitance by putting low-k material in fringe areas of the electrical field between adjacent interconnects.

After the interconnects are etched, a liner layer may be applied. FIG. 9 shows the application of a liner layer 18 over the metal interconnects and exposed surfaces of the dielectric layer. Liner layer 32 is an optional layer to protect metal interconnect lines 22 from solvents used in some spin-on low-k materials and prevent corrosion. Liner layer 32 can be eliminated when non-interactive dielectric materials are used, that is dielectric materials that will not react with the metal layer or materials used for the via contact. Liner layer 32 is typically a thin layer, 250 Å–1,000 Å coverage on blank wafer, of plasma enhanced TEOS with about 40% step coverage. The liner layer may be an etch stopping layer such as a low-dielectric organic spin-on-glass or silicon oxide for stopping the etch of the low-k material.

After the liner layer is applied, if used, the low-k material is applied as discussed above for the first embodiment. The diamond film layer is then applied over the surface of the substrate as shown in FIG. 9. A thin insulative layer may be applied prior to the diamond film to protect the low-k material from the diamond deposition and to increase uniformity of the diamond film. A layer of TEOS $SiO_2$ may then be applied and planarized to complete the first level metal as discussed for the first embodiment. This embodiment may also be repeated to form multiple levels of metalization.

An additional advantage of the embodiment above is the diamond film can be an effective etch stop or planarization stop. Since the diamond film is harder than the interdielectric layer, the planarity process, such as CMP, will be enhanced. The advantages of combining soft and hard layers for producing a substantially planar surface is detailed in U.S. Pat. No. 5,356,513 to Burke et al, assigned to International Business Machines Incorporated and incorporated herein by reference.

The embodiment illustrated in FIG. 10 is similar to FIG. 9 except that the diamond film layer has been etched away except for directly above the interconnects, and the low-k material is placed in between the contacts after etching the diamond film layer. Since the primary path for heat dissipation is believed to be directly through the interconnects, the diamond film layer adjacent to the interconnects is of less importance for dissipation of heat compared to that directly over the more thermally conductive interconnects. It may be advantages to remove this additional diamond film to reduce thermal stresses caused by mismatched coefficients of thermal expansion.

The present invention combines the advantages of low dielectric constant materials with traditional planarization techniques and adds the benefits of highly thermally conductive materials such as diamond film. Preferably, the low dielectric material is placed only between tightly spaced lines or critical areas. Since the interlayer dielectric is comprised of diamond and a traditional dielectric such as $SiO_2$, problems associated with structurally unsound low dielectric materials are alleviated.

The table, below, provides an overview of some embodiments and the drawings.

TABLE

| Drawing Element | Preferred or Specific Examples | Generic Term | Other Alternate Examples |
|---|---|---|---|
| 10 | Silicon Oxide | Insulating Layer | |
| 12 | Silicon Wafer | Substrate or Wafer | GaAs |
| 14 | Gate | Semiconductor Devices | Other semiconductor devices on the substrate. |
| 16 | CVD diamond | High Thermal Conductivity Layer | boron nitride, aluminum nitride, diamond-like-carbon, beryllium oxide, aluminum oxide |
| 18 | Contact Via | Via | |
| 20 | Ti | Adhesion Layer | TiW |
| 22 | TiN/AlCu/TiN | Interconnect Line | Trilayer of TiN/AlCu/TiN, TiW/AlCu/TiW; Alloys of Al, Cu, Mo, W, Ti, Si; poly-silicon, silicides, nitrides, carbides; or combinations thereof. |
| 24 | TEOS SiO$_2$ | Cap Layer | Oxide, nitride, dense glass, solid inorganic, solid organics, or other suitable rigid dielectric. |
| 26 | Parylene | Low Dielectric Constant Material | Other types of spin-on glass, Xerogel, Aerogel, vapor deposited polymer dielectrics such as teflon and polyimide, or an air gap or inert gas void. |
| 28 | Interconnect | Stack | |
| 30 | SiO$_2$ | Interlevel Dielectric | Oxide, nitride, dense glass, solid inorganic, solid organics, or other suitable rigid dielectric. |
| 32 | CVD oxide | Liner Layer | Other suitable rigid dielectric |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments. For example, a thermally conductive layer such as diamond film could be place both above and below each level of interconnects by combining the layers shown in the embodiments. Also, although the embodiments focused on diamond film as the high thermal conductivity layer, other materials may be substituted as shown in the above table.

What is claimed is:

1. A microelectronic structure comprising:
   (a) a semiconductor substrate;
   (b) a high thermal conductivity material on a said semiconductor substrate;
   (c) a plurality of interconnects on said high thermal conductivity material on said semiconductor substrate wherein the thickness of said high thermal conductivity material not directly below said interconnects is thinner than in areas directly below said interconnects;
   (d) a dielectric material between at least two of said interconnects and between said high thermal conductivity material in said thinner areas; and
   (e) an interlevel dielectric layer on said high thermal conductivity material, said interconnects and said dielectric material.

2. The structure according to claim 1, further comprising an adhesion layer between at least one of said interconnects and said high thermal conductivity material.

3. The structure of claim 1, wherein said dielectric material between said at least two interconnects is a low dielectric material.

4. The structure of claim 3 wherein said dielectric material has a dielectric constant of less than 3.

5. The structure of claim 1 wherein said interlevel dielectric is a planarized layer of nonconductive semiconductor material formed on said interconnects.

6. The structure of claim 1 further comprising a cap layer on at least two of said interconnects.

7. The structure of claim 1 wherein said high thermal conductivity material is selected from the group consisting of: diamond film, boron nitride, aluminum nitride, diamond-like-carbon, beryllium oxide, and aluminum oxide.

8. The structure of claim 7 wherein said diamond film is formed by CVD.

9. The structure of claim 7 wherein said diamond film is formed by laser ablation.

10. The structure of claim 4 wherein said low dielectric constant material is selected from the group consisting of: Polyimide, Polysilsequioxane, Benzocyclobutene, Parylene N, Florinated polyimide, Parylene F, Polynaphthalene, Amorphous Telflon, Polymer foams, Aerogel, Xerogel.

11. The structure of claim 1 wherein said high thermal conductivity material is only directly below said interconnects.

12. A microelectronic structure comprising:
   (a) a semiconductor substrate;
   (b) at least two interconnects on said semiconductor substrate; and
   (c) a low dielectric material between said interconnects on said substrate;
   (d) a high thermal conductivity material on a said interconnects wherein the thickness of said high thermal conductivity material not directly below said interconnects is thinner than in areas directly below said interconnects and said low dielectric material is also between said high thermal conductivity material in said thinner areas; and
   (e) an interlevel dielectric layer over said high thermal conductivity material, said interconnects and said low dielectric material.

13. The structure according to claim 12, further comprising a liner layer between said interconnects and said low dielectric material.

14. The structure of claim 12, wherein said low dielectric material between said at least two interconnects has a dielectric constant less than 3.

15. The structure of claim 14 wherein said low dielectric constant material is selected from the group consisting of: Polyimide, Polysilsequioxane, Benzocyclobutene, Parylene N, Florinated polyimide, Parylene F, Polynaphthalene, Amorphous Telflon, Polymer foams, Aerogel, Xerogel.

16. The structure of claim 12 wherein said dielectric layer is a planarized layer of nonconductive semiconductor material formed on said high thermal conductivity material.

17. The structure of claim 12 wherein said high thermal conductivity material is selected from the group consisting of: diamond film, boron nitride, aluminum nitride, diamond-like-carbon, beryllium oxide, and aluminum oxide.

18. The structure of claim 17 wherein said diamond film is an etch stop layer.

19. The structure of claim 12 further comprising multiple layers of the structure described by (b) through (e) in claim 13 on said substrate.

20. The structure of claim 12, wherein said high thermal conductivity material is only directly below said interconnects and said low dielectric material is also between said high thermal conductivity material on said interconnects.

* * * * *